United States Patent [19]

Hanoka et al.

[11] Patent Number: 4,557,037
[45] Date of Patent: Dec. 10, 1985

[54] METHOD OF FABRICATING SOLAR CELLS

[75] Inventors: Jack I. Hanoka, Brookline; Douglas A. Yates, Burlington; James A. Gregory, Sudbury, all of Mass.

[73] Assignee: Mobil Solar Energy Corporation, Waltham, Mass.

[21] Appl. No.: 681,498

[22] Filed: Dec. 13, 1984

Related U.S. Application Data

[63] Continuation-in-part of Ser. No. 666,973, Oct. 31, 1984, abandoned, which is a continuation of Ser. No. 563,132, Dec. 19, 1983, abandoned.

[51] Int. Cl.$^4$ ............................................. H01L 31/18
[52] U.S. Cl. .................................. 29/576 B; 29/572; 29/591; 136/256; 148/1.5; 250/492.2; 427/38; 427/74

[58] Field of Search ............... 148/1.5; 29/572, 576 B, 29/590, 591; 427/374, 8, 91–92, 305, 438, 88; 136/256; 250/492.2

[56] References Cited

U.S. PATENT DOCUMENTS

| | | | |
|---|---|---|---|
| 3,805,376 | 4/1974 | D'Asaro et al. | 29/570 |
| 4,086,102 | 4/1978 | King | 136/256 |
| 4,224,084 | 9/1980 | Pankove | 148/1.5 |
| 4,322,253 | 3/1982 | Pankove | 148/1.5 |

Primary Examiner—Aaron Weisstuch
Attorney, Agent, or Firm—Schiller & Pandiscio

[57] ABSTRACT

A solar cell fabrication procedure is described in which a hydrogen ion passivation step is used to form, inter alia, an altered silicon substrate surface layer to which immersion plated nickel will not readily adhere. The altered surface layer is formed by shadow casting an ion beam in a pattern corresponding to the desired front surface interelectrode configuration.

9 Claims, 1 Drawing Figure

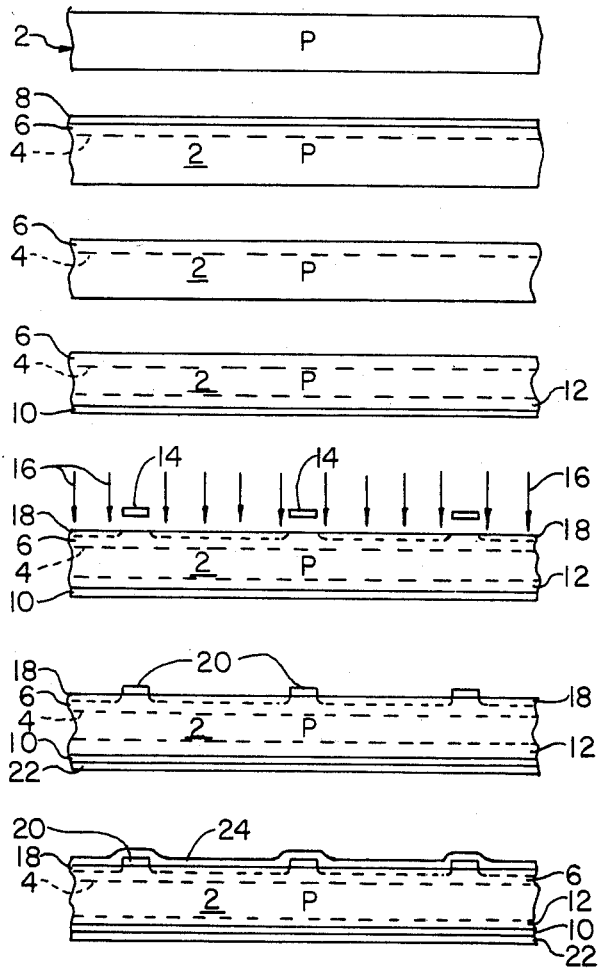
STARTING MATERIAL
N+ DIFFUSION
GLASS ETCH
Al DEPOSITION AND ALLOYING
H PASSIVATION
METALLIZATION
AR COATING

METHOD OF FABRICATING SOLAR CELLS

BACKGROUND OF THE INVENTION

This application is a continuation in part of application Ser. No. 666,973, filed Oct. 31, 1984, (abandoned), which is a continuation of application Serial No. 563,132, filed Dec. 19, 1983 (abandoned).

This invention pertains to the manufacture of photovoltaic cells and more particularly to an improved low-cost method of fabricating polycrystalline silicon solar cells wherein the damaged surface layer generated during hydrogen passivation is used as a plating mask for the metallization of the front surface electrodes.

Heretofore a common method of fabricating silicon solar cells has included the steps of forming a PN junction by diffusing a suitable dopant into the front side of a silicon wafer or ribbon, etching a grid electrode pattern in a protective dielectric masking layer formed on that front surface, depositing a nickel plating on all silicon exposed by the etching, solder dipping or overplating the nickel with copper and tin, removing the remainder of the dielectric masking layer from the front surface, and providing an anti-reflection coating on the newly exposed portions of the front surface.

While such a procedure may be applied to either single crystal or polycrystalline silicon, cost considerations make it desirable to fabricate solar cells from the latter. However, as is well known, because of the minority carrier losses at grain boundaries, dislocations, and the like, the efficiencies achieved with polycrystalline silicon solar cells are generally poorer than those of monocrystalline cells. This circumstance has been improved upon by introducing a monovalent element, such as hydrogen, into the structure to combine with the dangling bonds associated with the structural defects, thereby minimizing the minority carrier recombination loss.

As is known in the art, an important consideration in designing a cell processing sequence is that the combination of time and temperature in any step following the hydrogen passivation step should not cause the hydrogen introduced into the silicon to be diffused back out of the passivated substrate. Thus, for instance, it has been found that a hydrogen passivated cell subjected to a temperature of 600° C. for one-half hour in a vacuum loses substantially all the bonded hydrogen and returns to its pre-passivation level, as evidenced by its observed electron beam induced current activity. It should be noted in this regard that the junction diffusion step in solar cell fabrication typically involves temperatures on the order of 900° C.

It has also been found that hydrogen passivation normally heats the cell to a high enough temperature to cause base metals, such as copper, to migrate through the junction, thereby causing a "soft" diode or a short circuit. As shown, for instance, by C. H. Seager, D. J. Sharp, J. K. G. Panitz, and R. V. D'Aiello in *Journal of Vacuum Science and Technology*, Vol. 20, no. 3, pp 430-435 (March 1982), passivation of polycrystalline silicon may be accomplished with a Kaufman-type ion source used to produce a hydrogen ion beam in the kilo electron volt energy range. Relatively short exposure times (e.g. between 0.5 and 4 minutes) in a high ion energy and flux (e.g. 1 to 3 milliamperes per square centimeter) range appear to be optimal. Such exposures generally result in the substrate temperature rising to at least approximately 275° C., if the substrate is carefully contacted to an appropriate heat sink. Otherwise, temperatures in excess of 400° C. are readily achieved. It is important, however, that temperatures be limited to less than about 300° C. to avoid rapid migration of base metals into the silicon matrix. However, manipulation of substrate and heat sink to effect thermal control during passivation easily becomes the rate limiting factor in high throughput processing with such ion sources. Consequently, it is desirable to avoid heat sinking in order to obtain a low cost, high throughput process. Additionally, for EFG-type silicon ribbon, which may be economically produced, surface irregularities make heat sinking difficult.

Additionally, hydrogen passivation is most effective when the base silicon surface is exposed. Thus, any plating mask, such as the silicon nitride layer used in prior art processes, must be removed prior to passivation. Consequently, the front surface electrodes must be deposited prior to passivation.

As described in application Ser. No. 563,061, the altered surface layer produced in hydrogen ion beam passivation may be used as a plating mask for subsequent metallization steps. In greater detail, a preferred embodiment of the process described in detail therein as applied to the manufacture of silicon solar cells involves, interalia, the following steps: (1) forming a plating mask of a dielectric material on the front surface of a shallow-junction silicon ribbon so as to leave exposed those areas of the silicon to be later covered by the front surface electrode, (2) depositing a thin layer of nickel (or similar material) on the exposed silicon, (3) removing the plating mask, (4) hydrogen passivating the junction side of the ribbon, (5) sintering the nickel to form in part a nickel silicide, (6) plating additional metal(s) onto the metal-covered portions of the cell, and (7) anti-reflection coating the exposed surface of the silicon. Thereafter, the silicon may be further processed, e.g. to prepare it for connection to electrical circuits. The passivation alters the exposed surface of the junction side of the substrate so that it serves as a mask for the secondary plating step (6). In an alternative process, the heating of the sample during passivation supplies at least part of the energy for the nickel sintering step.

This procedure is further simplified in application Ser. No. 563,292, wherein it is taught that a negative plating mask (i.e., a mask covering only those areas of the front surface to be later covered by the front surface electrode) deposited on the front surface of the substrate may be used to control the extent of the altered surface layer produced by the ion beam, thereby permitting passivation before any front surface metallization, the mask being removed after passivation and prior to metallization.

Both of the procedures just outlined allow hydrogen passivation, with the consequent improvement in cell performance of polycrystalline substrates, with a preferable temperature protocol. However, even the simplest of the two procedures just outlined requires on the order of a dozen steps. Both procedures furthermore require that a surface layer on the substrate be formed into a temporary disposable mask, with the attendant expense of both time and non-recoverable material.

OBJECTS OF THE INVENTION

Accordingly, it is an object of the present invention to eliminate processing steps in the manufacture of solar cells from EFG-type ribbon or similar substrates.

It is a further object of the present invention to provide a processing sequence for the fabrication of solar cells including a hydrogen passivation step after the high temperature processing steps but before any base metals are incorporated in the structure yet which minimizes the use of non-recoverable material.

BRIEF DESCRIPTION OF THE INVENTION

These and other objects are met in the present invention wherein a removable and reusable mechanical mask is used to shadow-cast the ion beam used for hydrogen passivation onto the front surface of the substrate. The altered surface layer produced by the ion beam passing through the apertures in the mask forms a plating mask delimiting the areas of subsequent front surface metallization by immersion plating.

It will be appreciated that, by using a removabale mechanical mask to define the areas of the substrate exposed to the ion beam, the chemical milling steps used to form and remove the plating masks of prior art processing sequences are avoided. Further, the mask of the present invention is reusable. As a result, a greatly simplified and more cost efficient process is made possible.

Other objects of the invention will in part be obvious and will in part appear hereinafter. The invention accordingly comprises the several steps and the relation of one or more of such steps with respect to each of the others which are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description which is to be considered together with the accompanying drawing which illustrates a number of the steps involved in making solar cells according to a preferred form of the invention.

Throughout the drawing, like reference numbers refer to similar structure.

In the drawing, the thicknesses and depths of the several coatings and regions are not shown exactly in accordance with their relative proportions, for convenience of illustration.

DETAILED DESCRIPTION OF THE INVENTION

Referring now to the drawing, the preferred embodiment of the invention relates to the production of solar cells from EFG grown P-type silicon ribbon. As a first process requirement, one side (hereafter the "front side") of a pre-cleaned EFG P-type conductivity silicon ribbon 2 is subjected to a phosphorus diffusion process calculated to produce a relatively shallow junction 4 (i.e., a junction of between about 3,000 and about 7,000 Angstrom units deep), and an N-type conductivity region 6. As an example, a silicon ribbon of P-type conductivity made by the EFG process and having a resistivity of about 5 ohm-cm is cleaned by etching in a solution of $HNO_3(70\%):HF(49\%)$ in a ratio of between about 4:1 and 9:1 for about one to three minutes at a temperature of about 25° C. Thereafter the ribbon is subjected to a phosphorus diffusion process, as well known in the art. For instance, a layer of phophosilicate glass 8, formed as detailed in U.S. Pat. No. 4,152,824, may be used as a source for the phosphorus dopant.

Next, the layer of phosphosilicate glass 8 is etched away by immersing the substrate in a buffered HF solution. Thus, $(P_2O_5)_x(SiO_2)_y$, a phosphosilicate glass may be removed from the substrate by submerging the latter in $10NH_4F(40\%):1HF$ at a temperature of between about 25° C. and about 40° C. for a period of between about 15 seconds and 2 minutes.

Following this, the rear side of the substrate is coated with a layer 10 of an aluminum paste. The aluminum paste used to form layer 10 preferably comprises aluminum powder in a volatile organic vehicle, such as terpineol, that can be removed by evaporation.

This step is then followed by an alloying step in which the substrate is heated for about 0.25 to 2.0 minutes at a temperature greater than about 575° C. to remove any volatile or pyrolyzable organic components of the paste and to alloy the aluminum in the paste to the silicon substrate.

In the alloying step, the aluminum coating 10 alloys with the back side of the substrate to form a $P^+$ region 12 having a depth of from about 1 to about 5 microns.

Next, the cell is hydrogen passivated. A preferred method is to expose the front surface of substrate 2 to the hydrogen ion beam of a Kaufman-type (broad beam) ion source situated about 15 cm from the substrate. A mask 14 is positioned between the ion source and the substrate. This ion source is preferably operated at a pressure of between about 20 and 50 millitorr (of hydrogen), with a hydrogen flow rate on the order of about 25 to 40 s.c.c. per minute, with a potential of about 1700 volts d.c. between source and substrate, and with a beam current of between about 1 and 3 milliampere/cm$^2$ at the substrate. An exposure time of between about 1 and about 4 minutes has been found adequate both to minimize the minority carrier recombination losses typically experienced with EFG-type silicon cells (providing a passivation zone some 20 to 80 microns deep, or about 100 times as deep as junction 4) while simultaneously providing an altered surface layer 18 approximately 200 Angstrom units deep on the exposed portions of substrate 2.

The exact nature of altered surface layer 18 is not known. However, it is believed to be a damaged zone wherein the crystal structure has been somewhat disrupted, the silicon in part forming SiH or SiH$_2$ with hydrogen from the ion beam, yet wherein the material is possibly amorphous. A small amount of carbon or one or more hydrocarbons appear to be necessary for the formation of the desired altered surface layer. As first installed, the Kaufman ion source used was equipped with a graphite mounting stage about 5 inches (c. 13 cm) in diameter on which the substrates, typically 2 by 4 inches (5 by 10 cm) on a side, were centrally located. In some cases, when a silicon mounting stage was substituted for the graphite stage, the altered layer did not perform as a plating mask as well as when the graphite stage was employed. On the basis of this, it has been hypothesized that carbon or hydrocarbon vapor formed by the impact of the hydrogen ion beam on the graphite stage may form a dielectric layer on the surface of the substrate. Whatever its nature, it has been found that an altered surface layer 18 produced in accordance with this procedure with accelerating voltages between about 1400 and about 1700 volts and exposure times as short as 1 minute is sufficient to prevent subsequent immersion plating metallization of the substrate over altered layer 18.

Mask 14 is a metallic reticle in the pattern of the desired multi-fingered grid electrode, e.g., an electrode having the form illustrated in U.S. Pat. No. 3,686,036.

Mask 14 is preferably fabricated of molybdenum, although other metals such as invar, stainless steel, titanium, nickel, or the like, or graphite and similar high temperature non-metallic materials could also be used. Mask 14 is positioned, relative to the front surface of substrate 2 and the ion beam source, so as to shadow-cast the desired electrode grid pattern onto the front surface 20 when the ion beam source is activated. That is to say, mask 14 obstructs ion beam 16 in the desired electrode grid pattern while permitting irradiation of the substrate in the inter-electrode areas.

Next, metallization of the cell is undertaken. Both sides of the substrate are immersion plated with nickel, an adhesive deposition of nickel forming a nickel layer 22 on the back side over the entire area of the aluminum coating 10, while the adhesive deposition of nickel on the front side forms a nickel layer 20 directly on the surface of substrate 2 only over those areas free of altered surface layer 18. In this plating step, the altered surface layer 18 of the silicon forms a plating mask to which the nickel does not adhere. Immersion plating of the nickel layers may be done in various ways. Preferably it is accomplished in accordance with an immersion nickel plating process like or similar to the process described in U.S. Pat. No. 4,321,283 of Kirit Patel, et al.

As used herein the term "immersion plating" designates a process wherein an object is plated without the use of an externally applied electric field by immersing it in a plating bath that does not contain a reducing agent, and the plating involves a displacement reaction. In contrast the term "electroless plating" designates plating without the use of an externally applied electric field by immersing the object to be plated in a plating bath that contains a reducing agent.

As a preliminary step, the cleaned silicon substrate surface is pre-activated with a suitable agent. This pre-activation procedure is desirable since often the silicon surface will not itself support the electroless plating process, and any nickel plated on an untreated surface generally adheres thereto only poorly. Preferably, gold chloride is used as the activating agent, although platinum chloride, stannous chloride - palladium chloride, or other well known activators may be used, as described, for instance, in U.S. Pat. No. 3,489,603. Thereafter, both sides of the silicon ribbon are coated with a layer of nickel, preferably by immersing the ribbon in an aqueous bath as described in said U.S. Pat. No. 4,321,283, or in an aqueous bath of nickel sulfamate and ammonium fluoride at a pH of about 2.9 and at approximately room temperature for a period of about 2 to 6 minutes.

After the nickel has been applied, the substrate is heated in an inert atmosphere or a mixture such as nitrogen and hydrogen to a temperature and for a time sufficient to sinter the nickel layers and cause the nickel layer 20 on the front side of the substrate to react with the adjacent silicon to form a nickel silicide ohmic contact. For this purpose, the substrate is preferably heated to a temperature of about 300° C. for between about 15 and about 40 minutes. This provides a nickel silicide layer with a depth of about 300 Angstrom units at the interface between nickel layer 20 and substrate 2. The nickel layer 22 on the rear side forms an alloy with aluminum layer 10. The temperature of this sintering step should not greatly exceed 300° C., as higher temperatures lead to a poor quality nickel layer 20, and, as previously noted, may cause some of the passivating hydrogen to diffuse back out of the substrate material.

Preferably, the deposition and sintering of the nickel is controlled such that nickel layer 20 on the front side of the substrate has a thickness of no more than about 750 Angstrom units.

Thereafter, the nickel of layers 20 and 22 is preferably subjected to etching, as with nitric acid, and to further metallization, as with a second layer of nickel and one or more layers of copper. The additional nickel is applied by immersion plating, preferably in the manner previously described for formation of layers 20 and 22 since the added nickel will plate onto layers 20 and 22 but not onto the exposed areas of altered layer 18. Preferably copper is applied by immersion plating and/or electroplating, by techniques well known in the art. No masking of altered layer 18 is required since copper formed by immersion plating or electroplating will not adhere to the altered surface 18.

Following metallization, the cell edges (not shown) are trimmed, and an anti-reflection coating 24 is applied to the front surface of the cell. This may be accomplished by any of a number of known methods, such as by chemical vapor deposition or evaporation of, for instance, $TiO_2$. Alternatively, an anti-reflection coating 24 may be formed by the plasma deposition of silicon nitride at a temperature of about 150° C., as is well known in the art.

By way of example, the preferred method of practicing the present invention comprises performing the individual steps set forth hereinabove in the preferred mode described in detail for each step and in the sequence set forth.

It has been determined that solar cells made according to the foregoing process from EFG grown ribbons show between a 10 and 20% increase in average efficiency. In addition, for this material the hydrogen passivation step also markedly narrowed the distribution of cell efficiencies.

It will appreciated that the process of the present invention greatly simplifies production of solar cells. The method not only greatly reduces the number of steps required in the process but also eliminates the use of much nonrecoverable material. Thus, by eliminating the use of a photoresist to form a plating mask for the front surface electrodes, the present method eliminates the need to coat, expose, and develop such a resist, together with the required step of removing remaining resist. Similar considerations apply to equivalent processes of chemical milling.

It will be understood that the process detailed hereinabove may be modified without departing in scope from the invention. Thus, while the preferred embodiment of the method of the present invention makes use of the altered layer formed by hydrogen passivation to mask subsequent plating except on earlier plated nickel, the method may be used with other metals than nickel. For instance, as will be understood by those skilled in the art, the initial layer of the front surface electrodes on a shallow junction silicon device may be deposited by immersion plating any of a number of low reactivity materials capable of forming (preferably at a low temperature) an ohmic contact and serving as a barrier to the diffusion of copper or any other base metal deposited at a later stage. Suitable metals for use with copper include palladium, platinum, cobalt, and rhodium, as well as nickel. While all of these materials form silicides, a silicide layer is not essential. It is important, however, that the initial metal layer adhere properly, serve as an ohmic contact, and act as a barrier to the migration of any metal deposited later, as well as not significantly migrating to the junction itself.

Still other changes may be made without departing from the principles of the invention as, for example, (a) forming the P+ back region of the cell by using flame sprayed aluminum instead of an aluminum paste, or (b) using different methods of applying the second and subsequent coatings of nickel or other low reactivity material such as palladium, platinum, cobalt and rhodium, or (c) forming the junction by ion implantation. If no masking layer is deposited over the altered layer, the added nickel (or other low reactivity metal of the type described) must be applied by immersion plating.

Of course, the process provided by this invention is not limited to the production of solar cells from EFG substrates. Thus, for example, cast polycrystalline substrates, epitaxial silicon on metallurgical grade silicon or fine grade polysilicon layers formed by chemical or physical vapor deposition can be used to form relatively high efficiency solar cells according to the present invention. Further, the process is applicable to single crystal silicon. Then, too, the process may be practiced with N-type as well as P-type substrates.

In any of these cases, it will be appreciated that the junction may be formed by various processes, and not merely through phosphorous diffusion.

Since these and other changes may be made in the above processes without departing from the scope of the invention herein involved, it is intended that all matter contained in the above description or shown in the accompanying drawing shall be interpreted in an illustrative and not a limiting sense.

What is claimed is:

1. Method of fabricating solid state semiconductor devices comprising in sequence the steps of:
   (a) providing a silicon substrate having opposing first and second surfaces;
   (b) positioning a mechanical mask having selected apertures in juxtaposition to said first surface; and
   (c) exposing said first surface to a hydrogen ion beam through said selected apertures at an intensity and for a duration sufficient to form a surface layer on said first surface corresponding to said apertures and to which metals will only poorly adhere.

2. Method according to claim 1 wherein further after exposure to said hydrogen ion beam those portions of said front surface which were masked by said mask are metallized.

3. Method according to claim 2 wherein all of said front surface is exposed to metal during metallization.

4. Method according to ciaim 2 wherein said metallizaiton is performed using a metal chosen from the group of metals including nickel, palladium, cobalt, platinum, and rhodium.

5. Method according to claim 2 wherein said metallization comprises depositon of nickel from a bath containing a nickel salt and fluoride ions.

6. Method according to claim 1 and further including the step of forming a junction in said substrate adjacent said first surface prior to exposing said surface to said hydrogen beam.

7. Method according to claim 1 wherein said first surface is exposed to said hydrogen ion beam for a time and at an intensity sufficient to reduce the minority carrier losses in said substrate.

8. Method according to claim 1 further including the step of immersion plating to metallize those portions of said front surface which were masked by said mask.

9. Method according to claim 8 wherein said metallizing step is conducted so as to also metallize said second surface of said substrate.

* * * * *